US011355355B2

(12) United States Patent
Lee et al.

(10) Patent No.: US 11,355,355 B2
(45) Date of Patent: Jun. 7, 2022

(54) METHOD FOR PRODUCING CERAMIC SUBSTRATE, AND CERAMIC SUBSTRATE

(71) Applicant: Amosense Co., Ltd., Cheonan-si (KR)

(72) Inventors: Ji-Hyung Lee, Pyeongtaek (KR); Ik-Seong Park, Seoul (KR); Hyeon-Choon Cho, Seongnam (KR)

(73) Assignee: Amosense Co., Ltd., Cheonan (KR)

( * ) Notice: Subject to any disclaimer, the term of this patent is extended or adjusted under 35 U.S.C. 154(b) by 0 days.

(21) Appl. No.: 16/630,073

(22) PCT Filed: Aug. 23, 2018

(86) PCT No.: PCT/KR2018/009722
§ 371 (c)(1),
(2) Date: Jan. 10, 2020

(87) PCT Pub. No.: WO2019/039883
PCT Pub. Date: Feb. 28, 2019

(65) Prior Publication Data
US 2020/0357660 A1  Nov. 12, 2020

(30) Foreign Application Priority Data

Aug. 24, 2017  (KR) .................. 10-2017-0107002
Aug. 23, 2018  (KR) .................. 10-2018-0098396

(51) Int. Cl.
*H01L 21/48* (2006.01)
*H01L 23/373* (2006.01)
*H01L 41/332* (2013.01)

(52) U.S. Cl.
CPC ...... *H01L 21/4882* (2013.01); *H01L 23/3735* (2013.01); *H01L 41/332* (2013.01)

(58) Field of Classification Search
CPC ............. H01L 21/4882; H01L 23/3735; H01L 41/332; H05K 1/02; H05K 1/03;
(Continued)

(56) References Cited

U.S. PATENT DOCUMENTS

2013/0186677 A1* 7/2013 Lee .................. H05K 3/0058
 174/257
2013/0307372 A1* 11/2013 Ito .................. H03H 9/02574
 310/311
2014/0126155 A1* 5/2014 Imamura .................. C22C 5/08
 361/715

FOREIGN PATENT DOCUMENTS

EP  0670667 A1  9/1995
EP  1345480 A2  9/2003
(Continued)

OTHER PUBLICATIONS

Translation of JPH0786703A (Year: 1995).*
(Continued)

*Primary Examiner* — Duy Vu N Deo
(74) *Attorney, Agent, or Firm* — Brooks, Cameron & Huebsch, PLLC

(57) ABSTRACT

The present invention relates to a method of producing a ceramic substrate, the method including: joining a metal layer to each of opposite surfaces of a ceramic base material; forming, on the metal layers, a first electrode layer and a second electrode layer having a larger volume than the first electrode layer; calculating the volumes of the first and second electrode layers; and controlling a thickness of the second electrode layer, thereby controlling warpage which may occur due to a difference between the volumes of the first and second electrode layers. The present invention can reduce the defect rate of a ceramic substrate by controlling warpage that may occur due to the difference in volume taken up by the metal layers on the opposite surfaces of the base material.

1 Claim, 4 Drawing Sheets

(58) Field of Classification Search
CPC ... H05K 2201/0355; H05K 2203/0353; H05K 3/06; H05K 3/022; H05K 1/0306; H05K 1/0271
USPC .......................................................... 438/691
See application file for complete search history.

(56) References Cited

FOREIGN PATENT DOCUMENTS

| JP | 0786703 A | 3/1995 |
|----|-----------|--------|
| JP | H0786703 A | 3/1995 |
| JP | 2002252433 A | 9/2002 |
| JP | 2004207587 A | 7/2004 |
| JP | 2008235852 A | 10/2008 |
| JP | 2010118682 A | 5/2010 |
| KR | 100731604 B1 | 6/2007 |
| KR | 101053141 B1 | 8/2011 |

OTHER PUBLICATIONS

Extended Search Report from related European Application No. 18848939, dated Sep. 8, 2020, 9 pages.
International Search Report and Written Opinion from related PCT Application PCT/KR2018/009722, dated Nov. 28, 2018, 8 pages.

\* cited by examiner

METHOD FOR PRODUCING CERAMIC SUBSTRATE, AND CERAMIC SUBSTRATE

TECHNICAL FIELD

The present invention relates to a method of producing a ceramic substrate. More particularly, the present invention relates to a method of producing a ceramic substrate by controlling warpage of the ceramic substrate, and to a ceramic substrate produced thereby.

BACKGROUND ART

As well known in the art, a ceramic substrate is formed by integrally attaching a metal foil such as a copper foil to a ceramic base material. The ceramic substrate is manufactured through manufacturing processes such as active metal brazing (AMB), direct bond copper (DBC), and the like and may be classified into a ceramic AMB substrate, a ceramic DBC substrate, and the like depending on the manufacturing process.

While manufacturing of the ceramic DBC substrate involves directly bonding an oxidizable metal to a ceramic base material, manufacturing of the ceramic AMB substrate involves brazing an active metal to a ceramic base material to form a layer and brazing metal to a brazing layer.

In both processes, a metal layer is formed, followed by a photolithography process, and then a pattern layer is formed by etching.

However, in forming metal layers on opposite surfaces of a ceramic base material, the metal layers may differ from each other in area or thickness depending on the arrangement of patterns on the opposite surfaces. When the difference in the area or thickness is greater than a certain ratio, a phenomenon called "warpage" occurs in which a substrate warps toward one of the opposite surfaces under a high temperature environment.

As a result, when the degree of warpage is greater than 0.3%, the substrate is inevitably discarded as a defective product. The incidence rate of which accounts for a relatively large portion of the total production, causing a problem of continuous production loss.

According to empirical data, when the volume ratio between the opposite metal layers reached the range of 75 to 85%, the degree of warpage was greater than 0.3%.

As in an example of FIG. 1, when the volume ratio between a metal layer 2 formed on an upper surface of a base material 1 and a metal layer 3 formed on a lower surface of the base material is out of an appropriate range, a substrate may warp under a high temperature environment. As shown, a case where the volume of the metal layer 3 formed on the lower surface is larger is referred to as a negative warpage, and this negative warpage is more likely to occur than a positive warpage, which is the opposite case.

This may be solved by increasing the thickness of the base material. However, this approach is economically limited, and it is common for the base material to maintain a thickness ratio of approximately 1:1 with the metal layers.

The present invention relates to a method of controlling the degree of warpage of a substrate as shown in below FIG. 1.

The above information disclosed in this Background section is only for enhancement of understanding of the background of the invention and therefore it may contain information that does not form the prior art that is already known to a person of ordinary skill in the art.

DISCLOSURE

Technical Problem

Accordingly, the present invention has been made keeping in mind the above problems occurring in the related art, and an objective of the present invention is to provide a method of producing a ceramic substrate by controlling warpage which may occur due to the difference in volume taken up by metal layers on opposite surfaces of a base material, thereby reducing the defect rate of the ceramic substrate, and to provide a ceramic substrate.

Technical Solution

A method of producing a ceramic substrate according to one aspect of the present invention includes: joining a metal layer to each of opposite surfaces of a ceramic base material; forming, on the metal layers, a first electrode layer and a second electrode layer having a larger volume than the first electrode layer; calculating the volumes of the first and second electrode layers; and controlling a thickness of the second electrode layer, thereby controlling warpage which may occur due to a difference between the volumes of the first and second electrode layers.

Furthermore, the controlling the warpage may be performed when a volume ratio of the first electrode layer to the second electrode layer is equal to or greater than 75% to less than 85%.

Furthermore, the controlling the warpage may be performed by controlling the thickness of the second electrode layer such that a volume ratio of the first electrode layer to the second electrode layer after performing the controlling the warpage is 95% (±10%).

The method may further include determining that a failure has occurred when a volume ratio of the first electrode layer to the second electrode layer is less than 75%.

Furthermore, the thickness of the second electrode layer may be controlled by etching.

The present invention also provides a ceramic substrate produced by the above method.

Advantageous Effects

According to a method of producing a ceramic substrate according to the present invention, through control of warpage by eliminating the difference in volume of metal layers formed on opposite surfaces of the ceramic substrate, it is possible to produce a ceramic substrate without warpage under a high temperature environment.

This can result a reduced defect rate of the substrate, thereby improving processability and productivity.

BEST MODE

The attached drawings illustrating exemplary embodiments of the present invention and the contents describing the attached drawings should be referred to so as to gain a sufficient understanding of the present invention, advantages in the operations of the present invention, and the objectives that are achieved by the implementation of the present invention.

In the following description, it is to be noted that, when the functions of conventional elements and the detailed description of elements related with the present invention may make the gist of the present invention unclear, a detailed description of those elements will be omitted.

Figure 1:
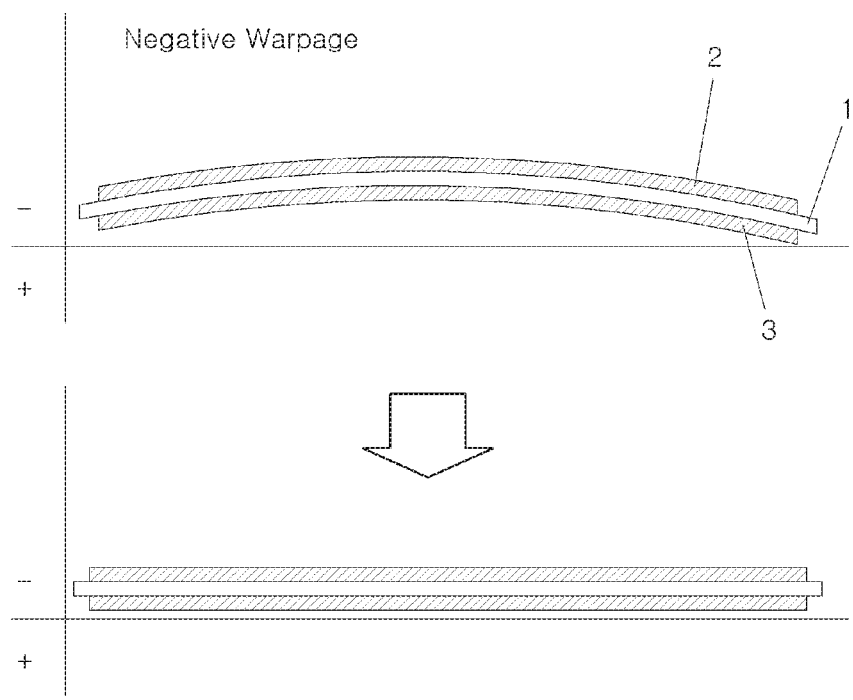
FIG. 1 is a view showing a concept of the present invention.
Figure 2:
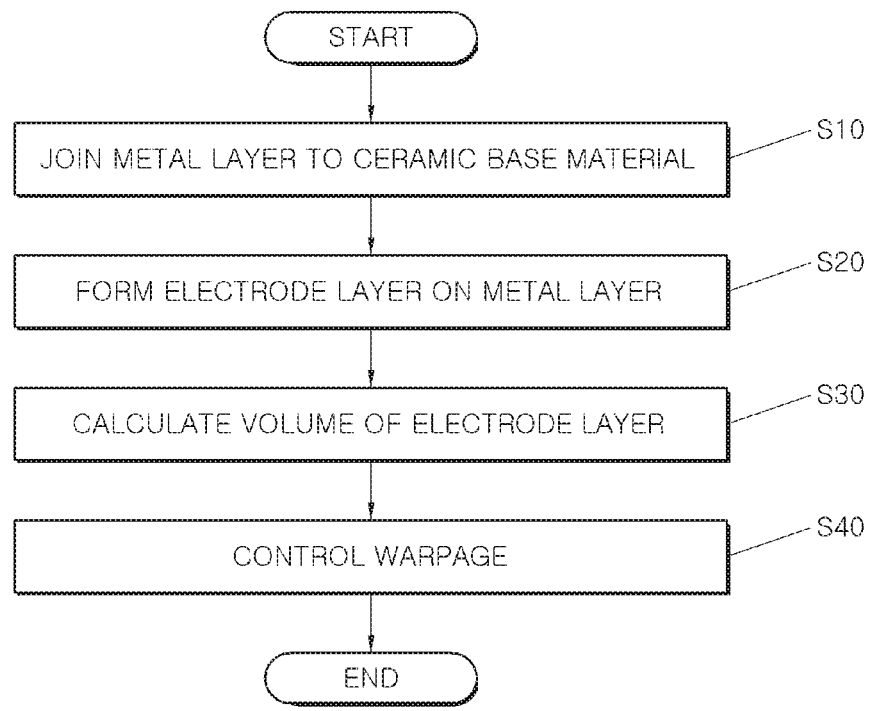
FIG. 2 is a flowchart showing a method of producing a ceramic substrate according to the present invention.
Figure 3:
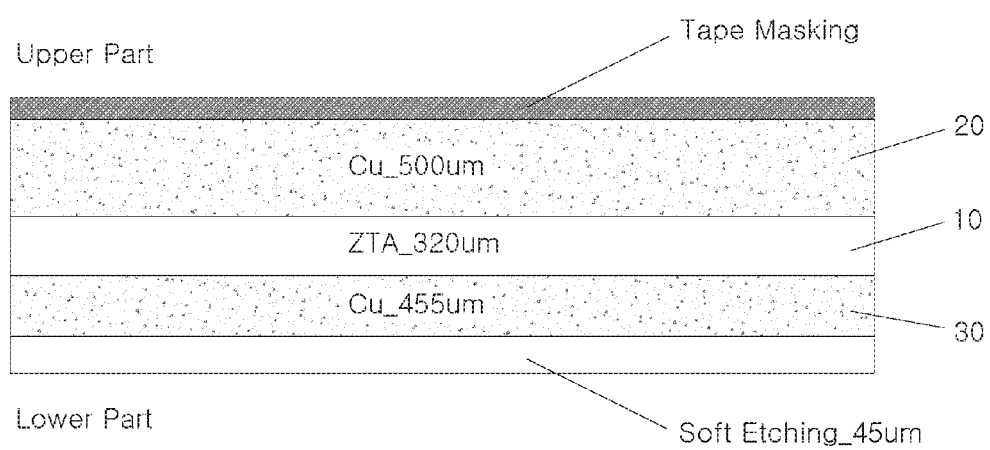
FIG. 3 is a view showing an example of a ceramic substrate produced by the present invention.

FIG. 2 is a flowchart showing a method of producing a ceramic substrate according to the present invention, and FIG. 3 is a view showing an example of a ceramic substrate produced by the present invention. Hereinafter, a method of producing a ceramic substrate, and a ceramic substrate according to embodiments of the present invention will be described with reference to FIGS. 2 and 3.

The method of producing the ceramic substrate according to the present invention is characterized by producing a ceramic substrate without causing warpage which may occur due to the difference in volume between metal layers such as copper foils joined to opposite surfaces of a ceramic base material, thereby preventing the substrate from warping toward one of the opposite surfaces.

First, a metal layer made of copper (Cu) foil is joined to each of opposite surfaces (upper and lower surfaces) of a ceramic base material 10 (S10). The joining of the metal layer may be implemented by an active metal brazing (AMB) method or direct bond copper (DBC) method to form a ceramic substrate.

Thereafter, an electrode layer is formed on each of the metal layers (S20).

The formation of the electrode layer is implemented by a photolithography process including photoresist application, masking, and exposure, and by an etching process.

Herein, a first electrode layer 20 is formed on one surface of the opposite surfaces and a second electrode layer 30 is formed on the other surface such that the second electrode layer 30 is larger in volume than the first electrode layer 20.

The volume of each of the electrode layers on the opposite surfaces having a volume difference as such is calculated through the product of the area and the thickness (S30).

Thereafter, the warpage is controlled by controlling the thickness of the second electrode layer 30 (S40).

This control is performed in such a manner that the volume of the first electrode layer/the volume of the second electrode layer×100% is calculated and a warpage control is performed when a volume ratio that results from calculation is in a range of equal to or greater than 75% to less than 85%.

According to the present invention, when the volume ratio of the first electrode layer to the=second electrode layer falls within this range, the warpage is expected to occur at a degree of warpage of at least 0.3%, whereby the warpage control can be performed.

It is preferable that according to experimental values, when the volume ratio is greater than 85%, it is determined to be within a normal range, and when the volume ratio is less than 75%, it is determined that a failure has occurred due to excessive warpage.

Therefore, the present invention may further include determining that a failure has occurred when the volume ratio is less than 75% as a result of calculation in S30.

Herein, the case where the first electrode layer defines the upper surface of the ceramic base material and the volume ratio of the first electrode layer/the second electrode layer is less than 85% corresponds to a negative warpage, and the case where the first electrode layer defines the lower surface and the volume ratio of the first electrode layer/the second electrode layer is less than 85% (in this case, the volume ratio of the second electrode layer/the first electrode layer is greater than 115%) corresponds to a positive warpage.

Further, the warpage control of S40 is characterized by controlling the thickness of the second electrode layer 30 having a relatively large volume by soft etching.

Through the controlling of the thickness of the second electrode layer as such, the present invention can obtain a final volume ratio of the first electrode layer/the second electrode layer of 95%.

Tolerance due to actual warpage control etching will occur. As a result, when the volume ratio of the first electrode layer/the second electrode layer is in a range of 85 to 105% corresponding to 95%±10%, the normal range in which substrate warpage is acceptable is fulfilled, whereby a substrate can be produced.

FIG. 3 is a view showing an example of a ceramic substrate produced by the above process.

A ceramic base material 10 has a thickness of 320 μm. In an example, a first electrode layer 20 defines an upper surface of the ceramic base material and a second electrode layer 30 defines a lower surface.

In an example, the area of the first electrode layer 20 is 5,179,2920 mm², and the area of the second electrode layer 30 is 6,055.3600 mm². In the absence of the warpage control of the present invention, the thickness of the first electrode layer 20 and the second electrode layer 30 is 500 μm and the volume ratio of the first electrode layer 20/the second electrode layer 30×100% is approximately 83%, in which case the negative warpage is expected to occur.

In this regard, the thickness of the second electrode layer 30 was controlled by etching according to the present invention such that the volume ratio of the first electrode layer 20/the second electrode layer 30×100% was 95%. As a result, it was possible to produce a ceramic substrate subjected to additional soft etching at a thickness of 45 μm.

As a result of the warpage control, the volume of the first electrode layer 20 is 2,589.646 mm², and the volume of the second electrode layer 30 is 2,755.188 mm², resulting in a volume ratio of the first electrode layer 20/the second electrode layer 30×100% being 94%, whereby the warpage of the ceramic substrate can be controlled.

Figure 4:
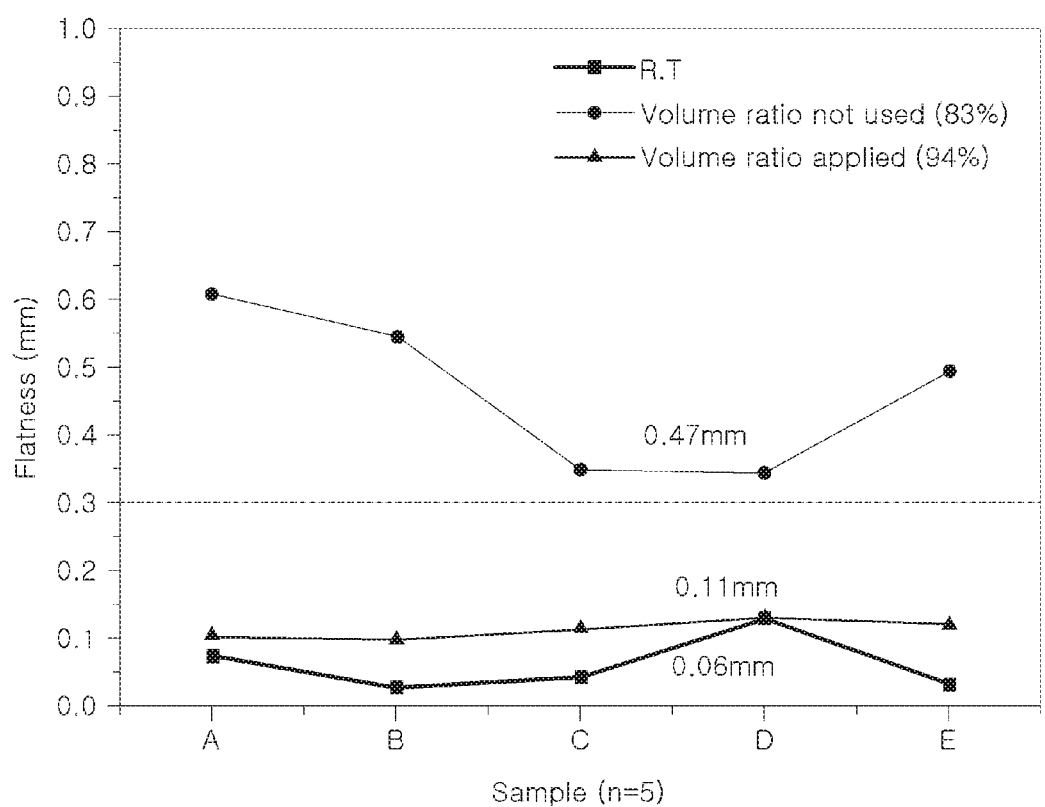
FIG. 4 is a view showing a change in occurrence of warpage of the ceramic substrate according to the present invention.

A result of comparing the occurrence of warpage between the ceramic substrate according to the present invention produced as described above with ceramic substrates having a volume ratio of 83% without warpage control is shown in FIG. 4, and results of comparison are summarized in Table 1.

TABLE 1

| No. | Electrode volume ratio | Average flatness (mm) | Variation (mm) | Notes |
| --- | --- | --- | --- | --- |
| 1 | 83% | 0.063 | — | room temperature warpage |
| 2 | 83% | 0.470 | 0.39 | after reflow at 350° C. |
| 3 | 94% | 0.110 | 0.04 | after reflow at 350° C. |

Results of five samples are shown. As shown, it was found that in the case of 83% volume ratio without warpage control, the average flatness was 0.063 mm at room temperature (R.T.). It was further found that in the case of 83% volume ratio without warpage control, the average flatness was 0.470 mm, indicating a significant change occurred.

However, it was found that in the case of the substrate subjected to the warpage control according to the present invention, the average flatness was 0.110 mm, which was a very small value.

It was further found that in the case of the substrate subjected to the warpage control according to the present invention, the variation after reflow at 350° C. by soldering was 0.04 mm, which was a very small value.

Although the present invention has been described above with reference to the exemplary drawings, the present invention is not limited to only the exemplary embodiments set forth herein and it will be understood by those skilled in the art that various changes and modifications may be made therein without departing from the spirit and scope of the present invention. Therefore, such changes and modifications should belong to the claims of the present invention, and the scope of the present invention should be determined on the basis of the appended claims.

DESCRIPTION OF THE REFERENCE NUMERALS IN THE DRAWINGS

10: ceramic base material
20: first electrode layer
30: second electrode layer
S10: join metal layer to ceramic base material
S20: form electrode layer on metal layer
S30: calculate volume of electrode layer
S40: control warpage

The invention claimed is:

1. A method of producing a ceramic substrate, the method comprising:
joining a first metal layer and a second metal layer to each of opposite surfaces of a ceramic base material;
forming a first electrode layer by etching the first metal layer;
forming a second electrode layer having a larger volume than the first electrode layer by etching the second metal layer;
calculating the volumes of the first and second electrode layers;
calculating a volume ratio of the first electrode layer to the second electrode layer;
determining the volume ratio is less than 75% and that a failure has occurred;
determining the volume ratio is equal to or greater than 75% to less than 85% and in response to the volume ratio being equal to or greater than 75% to less than 85%, reducing a thickness of the second electrode layer by additional etching of the second electrode layer and controlling the volume ratio to 95% (±10%); and
determining the volume ratio is 85% to 105% and is within a normal range.

* * * * *